(12) United States Patent
Blomgren et al.

(10) Patent No.: US 7,031,897 B1
(45) Date of Patent: Apr. 18, 2006

(54) SOFTWARE MODELING OF LOGIC SIGNALS CAPABLE OF HOLDING MORE THAN TWO VALUES

(75) Inventors: James S. Blomgren, Austin, TX (US); Fritz A. Boehm, Dripping Springs, TX (US)

(73) Assignee: Intrinsity, Inc., Austin, TX (US)

( * ) Notice: Subject to any disclaimer, the term of this patent is extended or adjusted under 35 U.S.C. 154(b) by 536 days.

(21) Appl. No.: 09/405,618

(22) Filed: Sep. 24, 1999

(51) Int. Cl.
G06F 17/50 (2006.01)
G06F 15/16 (2006.01)

(52) U.S. Cl. .......................... 703/14; 703/15; 703/17; 709/247

(58) Field of Classification Search .................. 716/17; 703/14, 15, 3, 21; 709/247
See application file for complete search history.

(56) References Cited

U.S. PATENT DOCUMENTS

| 4,675,832 | A | * | 6/1987 | Robinson et al. | ........... 345/441 |
| 4,725,971 | A | | 2/1988 | Doshi et al. | |
| 5,051,941 | A | * | 9/1991 | Takamine et al. | ............. 703/15 |
| 5,706,476 | A | * | 1/1998 | Giramma | .................... 703/15 |
| 5,884,065 | A | * | 3/1999 | Takasaki | ..................... 703/14 |
| 5,960,188 | A | * | 9/1999 | Linke et al. | ................... 703/14 |
| 6,066,965 | A | | 5/2000 | Blomgren et al. | |
| 6,289,497 | B1 | * | 9/2001 | Leight et al. | .................. 716/17 |
| 6,367,065 | B1 | | 4/2002 | Leight et al. | |

OTHER PUBLICATIONS

"IEEE Standard Multivalue Logic System for VHDL Model Interoperbility (Std_logic_1164)", Mar. 18, 1993, The Institute of Electrical and Electronics Engineers, Inc. New York, N.Y.; ISBN 1-55937-299-0.*

C. Rozon "On the Use of VHDL as a Multi-Valued Logic Simulator", IEEE 1996, pp. 110-115.*
U.S. Patent Application, "Multiple-State Simulator for Non-Binary Logic." Inventors: Blomgren, et al., U.S. Appl. No. 09/405,474, filed on Sep. 24, 1999.
U.S. Patent Application, "Method and Apparatus for a Monitor that Detects and Reports a Status Event to a Database." Inventors: Weber, et al., U.S. Appl. No. 09/406, 017, filed on Sep. 24, 1999.

(Continued)

*Primary Examiner*—Kevin J. Teska
*Assistant Examiner*—Dwin M. Craig
(74) *Attorney, Agent, or Firm*—Matthew J. Booth & Associates PLLC; Matthew J. Booth

(57) ABSTRACT

A method of efficiently simulating logic designs comprising signals that are capable of having more than two unique decimal values and one or more unique drive states, such as designs based upon the new N-nary logic design style, is disclosed. The present invention includes a signal model that models N-nary signal value, drive strength, and signal definition information in a specific format that supports the ability of the simulator to simulate the operation of the N-nary logic gates such as adders, buffers, and multiplexers by arithmetically and logically manipulating the unique decimal values of the N-nary signals. The simulator comprises an input logic signal model reader, an arithmetic/logical operator, an output logic signal model generator, and an output message generator that generates one or more output- or input-signal-specific output messages that pack relevant simulation data into a format optimized to the architecture of the simulation host.

15 Claims, 7 Drawing Sheets

OTHER PUBLICATIONS

U.S. Patent Application, "Method and Apparatus that Reports Multiple Status Events with a Single Monitor." Inventors: Weber, et al., U.S. Appl. No. 09/406,016, filed on Sep. 24, 1999.

Rozon, C., On the Use of VHDL as a Multi-Valued Logic Simulator, Proceedings, 26th International Symposium on Multiple-Valued Logic, May 29-31, 1999, pp. 110-115.

Woods, S., Gate-Level Simulation of Digital Circuits Using Multi-Valued Boolean Algebras, Digest of Technical Papers, 1995 IEEE/ACM International Conference on Computer-Aided Design, Jan. 6-9, 1995, pp. 413-419.

Ubar, R., Multi-Valued Simulation of Digital Circuits, 1997 21st International Conference on Microelectronics, Sep. 14-17, 1997, pp. 721-724, vol. 2.

IEEE Standards Board, IEEE Standard 1076-1993, IEEE Standard VHDL Language Reference Manual, Approved Sep. 15, 1993.

Tay, J.C. et al., CSL (Part 1), Modelling General N-ary, Logical CSPs, Proceedings, Ninth IEEE International Conference on Tools with Artificial Intelligence, 1997, Nov. 3-8, 1997, pp. 414-421.

Tay, J.C. et al. CSL (Part II), A Compiler for LCSP, Proceedings, Ninth IEEE International Conference on Tools with Artificial intelligence, Nov. 3-8, 1997.

Werner, W. and W. Minnick, User Requirements for Digital Design Verification Simulators, Annual ACM IEEE Design Automation Conference: Proceedings of the Symposium on Design Automation and Microprocessors, 1977, pp. 36-43.

* cited by examiner

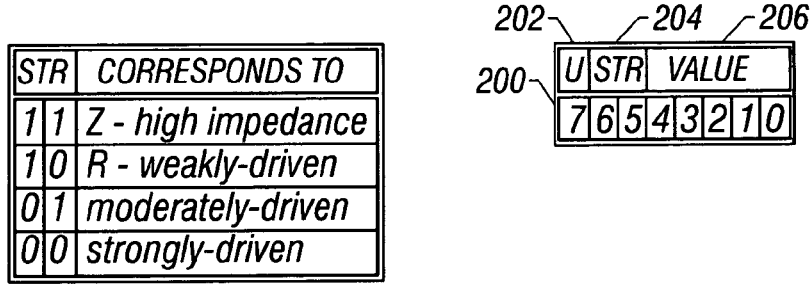

| STR | | CORRESPONDS TO |
|---|---|---|
| 1 | 1 | Z - high impedance |
| 1 | 0 | R - weakly-driven |
| 0 | 1 | moderately-driven |
| 0 | 0 | strongly-driven |

| VALUE | | | | | CORRESPONDS TO | VALUE | | | | | CORRESPONDS TO |
|---|---|---|---|---|---|---|---|---|---|---|---|
| 0 | 0 | 0 | 0 | 0 | N-nary signal value = 0 | 1 | 0 | 0 | 0 | 0 | N-nary signal value = 16 |
| 0 | 0 | 0 | 0 | 1 | N-nary signal value = 1 | 1 | 0 | 0 | 0 | 1 | N-nary signal value = 17 |
| 0 | 0 | 0 | 1 | 0 | N-nary signal value = 2 | 1 | 0 | 0 | 1 | 0 | N-nary signal value = 18 |
| 0 | 0 | 0 | 1 | 1 | N-nary signal value = 3 | 1 | 0 | 0 | 1 | 1 | N-nary signal value = 19 |
| 0 | 0 | 1 | 0 | 0 | N-nary signal value = 4 | 1 | 0 | 1 | 0 | 0 | N-nary signal value = 20 |
| 0 | 0 | 1 | 0 | 1 | N-nary signal value = 5 | 1 | 0 | 1 | 0 | 1 | N-nary signal value = 21 |
| 0 | 0 | 1 | 1 | 0 | N-nary signal value = 6 | 1 | 0 | 1 | 1 | 0 | N-nary signal value = 22 |
| 0 | 0 | 1 | 1 | 1 | N-nary signal value = 7 | 1 | 0 | 1 | 1 | 1 | N-nary signal value = 23 |
| 0 | 1 | 0 | 0 | 0 | N-nary signal value = 8 | 1 | 1 | 0 | 0 | 0 | N-nary signal value = 24 |
| 0 | 1 | 0 | 0 | 1 | N-nary signal value = 9 | 1 | 1 | 0 | 0 | 1 | N-nary signal value = 25 |
| 0 | 1 | 0 | 1 | 0 | N-nary signal value = 10 | 1 | 1 | 0 | 1 | 0 | N-nary signal value = 26 |
| 0 | 1 | 0 | 1 | 1 | N-nary signal value = 11 | 1 | 1 | 0 | 1 | 1 | N-nary signal value = 27 |
| 0 | 1 | 1 | 0 | 0 | N-nary signal value = 12 | 1 | 1 | 1 | 0 | 0 | N-nary signal value = 28 |
| 0 | 1 | 1 | 0 | 1 | N-nary signal value = 13 | 1 | 1 | 1 | 0 | 1 | N-nary signal value = 29 |
| 0 | 1 | 1 | 1 | 0 | N-nary signal value = 14 | 1 | 1 | 1 | 1 | 0 | N-nary signal value = 30 |
| 0 | 1 | 1 | 1 | 1 | N-nary signal value = 15 | 1 | 1 | 1 | 1 | 1 | N-nary signal value = 31 |

*FIG. 4*

CIN = 0

| RESULT | OPERAND 2 | | | |
|---|---|---|---|---|
| OPERAND 1 | 0 | 1 | X | Z |
| 0 | 0 | 1 | X | X |
| 1 | 1 | 0 | X | X |
| X | X | X | X | X |
| Z | X | X | X | X |

| CARRY-OUT | OPERAND 2 | | | |
|---|---|---|---|---|
| OPERAND 1 | 0 | 1 | X | Z |
| 0 | 0 | 0 | 0 | 0 |
| 1 | 0 | 1 | X | X |
| X | 0 | X | X | X |
| Z | 0 | X | X | X |

CIN = 1

| RESULT | OPERAND 2 | | | |
|---|---|---|---|---|
| OPERAND 1 | 0 | 1 | X | Z |
| 0 | 1 | 0 | X | X |
| 1 | 0 | 1 | X | X |
| X | X | X | X | X |
| Z | X | X | X | X |

| CARRY-OUT | OPERAND 2 | | | |
|---|---|---|---|---|
| OPERAND 1 | 0 | 1 | X | Z |
| 0 | 0 | 1 | X | X |
| 1 | 1 | 1 | 1 | 1 |
| X | X | 1 | X | X |
| Z | X | 1 | X | X |

CIN = X

| RESULT | OPERAND 2 | | | |
|---|---|---|---|---|
| OPERAND 1 | 0 | 1 | X | Z |
| 0 | X | X | X | X |
| 1 | X | X | X | X |
| X | X | X | X | X |
| Z | X | X | X | X |

| CARRY-OUT | OPERAND 2 | | | |
|---|---|---|---|---|
| OPERAND 1 | 0 | 1 | X | Z |
| 0 | 0 | X | X | X |
| 1 | X | 1 | X | X |
| X | X | X | X | X |
| Z | X | X | X | X |

*FIG. 5B*

SOFTWARE MODELING OF LOGIC SIGNALS CAPABLE OF HOLDING MORE THAN TWO VALUES

BACKGROUND OF THE INVENTION

1. Field of the Invention

The present invention relates to the field of digital system simulation, and more specifically, to simulating non-binary digital systems, defined as digital systems wherein input and output signals can have more than two defined logical states. In particular, the present invention provides an efficient methodology and environment for simulating digital systems designed in the N-nary logic design style.

2. Description of the Related Art

N-nary logic is a new dynamic logic design style fully described in a patent application, U.S. patent application Ser. No. 09/019,355, filed Feb. 5, 1998, now U.S. Pat. No. 6,066,965, and titled "Method and Apparatus for a N-Nary logic Circuit Using 1-of-4 Signals", which is incorporated herein for all purposes and is hereinafter referred to as "The N-nary Patent."

Supporting a new logic design style requires the invention of new design support techniques and tools to facilitate the computer-aided design and analysis of logic circuits and their constituent subcircuits. The N-nary logic design style is no exception. For example, the following copending patent applications, incorporated herein for all purposes, disclose a computer-aided design methodology and tool, and an associated hardware description language suitable for use by designers employing the N-nary logic design style:

| U.S. patent application Ser. No. | Date Filed | U.S. Pat. No. | Title |
|---|---|---|---|
| 09/210,408 | Dec. 11, 1998 | 6,289,497 | Method and Apparatus for N-nary Hardware Description Language |
| 09/210,410 | Dec. 11, 1998 | 6,367,065 | Method and Apparatus for N-nary Logic Circuit Design Tool |

THESE applications are collectively referred to hereinafter as "The N-nary Design Tools Patents."

The N-nary Design Tools Patents disclose a methodology and apparatus for describing and developing the physical design and interconnectivity of N-nary gates and circuits. As described in the N-nary Design Tools Patents, a designer developing a logic circuit in the N-nary logic style produces a syntax statement, preferably encoded in a combination of ANSI C and the N-nary C language disclosed in U.S. patent application Ser. No. 09/210,408. This syntax statement describes both the logical function implemented by the logic circuit being designed and the specific configuration of transistors required to build said circuit. As described in detail in the N-nary Design Tools Patents, the design tool disclosed therein compiles the syntax statement and generates both a behavioral model, which is a software-implemented simulation of the logic circuit under design, and a schematic, which is a physical description of the logic circuit under design. The focus of the present invention is on the content and use of the behavioral model that is an output of the design tool.

As semiconductors have become more and more advanced, with increasingly complex levels of integration, semiconductor designers have come to rely upon the use of software behavioral models to simulate and verify circuits under design as an important part of the design process. Commercially-available proprietary logic simulation tools have been developed to support this verification effort. These simulators operate on a behavioral model of a circuit under design by providing simulated inputs having various characteristics, and determining the associated outputs.

The simplest logic simulators in use today for binary-based designs are two-state models, meaning that they model only the two valid logical states of binary wires and gates (either a 1 or a 0). More sophisticated models also account for a number of other possible states of the wires and gates in a binary design. Three-state models provide for both valid logical states, plus the uninitialized state (i.e., possible states in a three-state model are 1, 0, and X). This is a popular extension because it may allow designers to simplify the hardware of complex designs by eliminating power-on reset functions in as much of the logic as possible. A three-state simulation allows the designer to ensure that no operation depends upon a gate output until that gate output is loaded from a valid, defined source.

Four-state models add the "undriven" or high-impedance state (commonly designated "Z"). This is particularly useful for wires that can be driven from more than one location. Only one driver is allowed to drive the wire at a time, with the remainder being put into a high impedance state. The value of the wire is determined by finding a driver in the low impedance state and selecting its output value.

There are a variety of extensions beyond the four-state model where the degree to which the driver is being driven is included for each possible logical value. For example, a simple nine-state model extends the four-state model by replacing the Z state with the S, R and Z state modifiers, or strengths. The S state indicates the value is driven "strong", usually by having an ON transistor connected to the appropriate power or ground plane. The R state indicates that the value is driven "weak", usually by having a resistor (often constructed from a properly biased transistor) connected to the appropriate power or ground plane. The Z state indicates the wire is not driven, but the value which last appeared on the wire is included. In this way, the wire is modeled as a capacitor which retains its value. A popular variation of the simple nine-state simulator provides for strong and resistive versions of the 0, 1 and X states, along with high-impedance, undefined and uninitialized states, all without regard to the boolean value which last appeared on the wire.

Finally, the twelve-state model extends the simple nine-state model by providing for indeterminate versions of the 0, 1, and X states.

Table 1 provides a summary of the logic states supported by existing simulation tools currently used to evaluate and verify typical binary-based logic designs.

TABLE 1

Prior Art

| Model state level | Logic states supported | Definitions |
|---|---|---|
| 2-state | 0, 1 | |
| 3-state | 0, 1, X | X = uninitialized |
| 4-state | 0, 1, X, Z | Z = "undriven" or high-impedance |

TABLE 1-continued

Prior Art

| Model state level | Logic states supported | Definitions |
|---|---|---|
| 9-state | 0S, 1S, XS, 0R, 1R, XR, 0Z, 1Z, XZ | S = "Strongly" driven; R = "weakly" driven; Z = not driven, value of wire = last known value |
| MVL-9 | 0S, 1S, XS, 0R, 1R, XR, Z, UI, UD | Z = not driven; last value of wire ignored UI = uninitialized; last value of wire ignored UD = undefined; last value of wire ignored |
| 12-state | 0S, 1S, XS, 0R, 1R, XR, 0Z, 1Z, XZ, 0I, 1I, XI | I = Indeterminate |

Designers have found that while extended-state logic simulation on a computer workstation is a powerful verification tool, it is expensive in terms of the time required to compute the various possible outputs of the design under verification, and in terms of the memory capacity required by the verification system. The overall simulation time is sensitive to the amount of memory used by the simulation as well as the number of individual discrete components of the design to be simulated. The more logic that is being simulated, the more memory that is used. This invention helps to limit the amount of computations and memory required for simulating N-Nary designs which thereby improves performance of the simulation.

To model all possible inputs of a design and determine the output of the design, state-based models commonly use truth tables that correspond to the boolean equation or logic function that the design implements. Assuming that a gate simulation truth table contains an entry for every combination of the gate's inputs and outputs, the size of the truth table is determined by the equation $$N = (x\text{-state})^{(I+o)}$$

where

N = the number of entries in the truth table;

x-state = the number of states to be modeled;

I = the number of possible inputs to the gate;

o = the number of possible outputs to the gate.

Applying this equation, we see that using a 4-state model to analyze a gate with a total of ten inputs and outputs would require a truth table with 1024K entries, corresponding to 1024K bytes of memory. Adding two more input or output pins to the gate would increase the size of the truth table to 6384K. As these examples demonstrate, modeling complex binary gates using extended-state modeling on a typical computer workstation quickly becomes impractical, due to memory limitations. Designers working in this area have developed a number of workaround solutions, such as mapping large truth table functions to multiple smaller truth table functions, or ignoring certain states within a multiple-state model for certain designs, to decrease the size of the relevant truth table. Nevertheless, these workaround solutions are less than ideal, and negatively impact the capability of the verification tool and the performance of the simulation itself.

Although these logic simulator tools support multiple states within a design, they were designed for and are most applicable to binary logic. The various states modeled generally relate only to initialization or drive strength, and the only two valid functional values are logical 0 and logical 1. Attempting to use any of these modeling tools to verify a non-binary N-nary design is complicated and inefficient.

The N-nary logic family supports a variety of signal encodings. All signals in N-nary logic are of the 1-of-N form where N is any integer greater than one. In N-nary logic, a bundle or group of N wires are used to indicate one of N possible signal values. The signal value is determined by which one of the N wires within the bundle is asserted (logical 1). Table 2 demonstrates, using a 1-of-4 N-nary signal as an example, the correlation between the N-nary signal value (in Table 2, decimal values 0–3) and which of the N wires that comprise the N-nary signal (wires A[3] through A[0]) is asserted.

TABLE 2

| N-nary (1-of-4) Signal A Decimal Value | N-nary (1-of-4) Signal A 1-of-4 wires asserted | | | |
|---|---|---|---|---|
| A | A[3] | A[2] | A[1] | A[0] |
| 0 | 0 | 0 | 0 | 1 |
| 1 | 0 | 0 | 1 | 0 |
| 2 | 0 | 1 | 0 | 0 |
| 3 | 1 | 0 | 0 | 0 |

As shown in Table 2, and described further in the N-nary Patent, more than one wire will never be asserted for a valid 1-of-N signal. Similarly, N-nary logic generally requires that a high voltage be asserted on only one wire for all values, even 0. (Some versions of N-nary logic allow for a valid N-nary "null" signal, where a high voltage is not asserted on any wire. In these versions, a valid "null" signal is a signal that has not yet evaluated and whose value is not required to accomplish a given function.) In versions that do not support a "null" signal, an N-nary signal that does not have a high voltage asserted on any wire is considered to be an invalid signal.

As Table 2 illustrates, N-nary logic design differs from binary logic in that there is a distinction between an N-nary wire and an N-nary signal. While N-nary signals are not limited to binary values (an N-nary signal can have N possible values), each wire of an N-nary signal can be considered to be binary, in that its functional value can only be either 0 or 1.

Any one N-nary logic gate may comprise multiple input N-nary signals and/or multiple output N-nary signals. In such a case, a variety of different N-nary signal encodings may be employed. For instance, N-nary design principles would support a gate that comprises two inputs and two outputs, where the inputs are a 1-of-4 signal and a 1-of-2 signal and the outputs are a 1-of-4 signal and a 1-of-3 signal. This gate could be verified using one of the traditional binary verification tools discussed above, applied at the N-nary wire (rather than N-nary signal) level. However, this gate's input and output wires total 13. Even a 4-level simulation would require a truth table with 67,109K entries. As this example demonstrates, attempting to simulate even a few N-nary gates at this level would be far too expensive, both in terms of computation time and local workstation cache memory capacity. Therefore, a new simulation tool and methodology enabling designers working in the N-nary logic design style to properly and efficiently verify their designs is required.

SUMMARY

The present invention comprises a method of efficiently simulating logic designs comprising signals that are capable of having more than two unique decimal values and multiple unique drive states, such as designs based upon the new N-nary logic design style. The present invention models N-nary signals in a specific format comprising a signal value field that holds the signal's unique decimal value, a signal strength field that conveys the signal's drive state, and a signal definition field that conveys whether the signal is a defined or an undefined signal. The unique decimal value of defined signals occupies the least significant bits in the model, thus allowing the simulator to perform mathematical and logical operations on the gate's input and output signals at the signal value level, rather than at the wire/bit level.

The simulator, sometimes also referred to herein as a behavioral model, comprises an executable software-implemented simulation model that is compiled from a gate syntax statement and one or more simulation environment files. The simulator generally comprises a plurality of instructions wherein the decimal values of a gate's input logic signals, modeled in accordance with the conventions described above, are determined and mathematically or logically manipulated to obtain the decimal value of each of the gate's one or more output logic signals. Simulating gates such as adders, buffers, and multiplexers by mathematically and/or logically manipulating the decimal values of the gates' input and output signals is a much more efficient approach than traditional binary-based simulation techniques, where simulation of these kinds of gates can require complex truth tables as described above, and/or breaking the gate down into its primitive logic components.

The simulator of the present invention comprises an input logic signal model reader that determines the unique decimal value of the gate's modeled input signals that are defined signals, an arithmetic/logical operator that mathematically and/or logically manipulates the decimal values of the gate's input signals to obtain the decimal value of the gate's output signals, an output logic signal model generator that generates a signal model for each of the output logic signals determined by the arithmetic/logical operator, and an output message generator that generates one or more output messages that pack relevant simulation data into a format optimized for the architecture of the simulation host. In a preferred embodiment, each output message is output- or input-signal-specific, and includes the following information corresponding to a specific input or output logic signal of the gate being simulated: current (or last) unique decimal value, maximum unique decimal value possible, bit mask indicating unique decimal values held thus far, null value propagation possible, and number of times null value has been propagated.

BRIEF DESCRIPTION OF THE DRAWINGS

To further aid in understanding the invention, the attached drawings help illustrate specific features of the invention and the following is a brief description of the attached drawings:

FIG. 4 shows the simulation representation of an N-nary signal value, along with four possible drive states of the signal, as the information would be modeled and stored in a single byte of memory in a preferred embodiment of the present invention.

FIGS. 5A and 5B show a typical approach for simulating a binary-based simple arithmetic function employed by a prior art 4-level simulator, with accompanying truth tables

DETAILED DESCRIPTION OF THE INVENTION

The present invention comprises a simulation environment useful in conducting logic simulation of designs that use signals capable of holding multiple signal values, rather than being limited to 0 or 1. The present invention includes a signal modeling convention that improves memory utilization and simulation performance for a multi-state simulation, a methodology for simulating primitive logic and arithmetic functions that is much simpler and more efficient than the bit-by-bit comparison techniques employed by current binary-based simulation techniques, and a methodology for storing and producing simulation output information that is easily tailored to produce information required by the designer and to take advantage of the architecture of the simulation host. This disclosure describes numerous specific details that include specific structures, circuits, and logic functions in order to provide a thorough understanding of the present invention. One skilled in the art will appreciate that one may practice the present invention without these specific details.

For the reasons described above, simulating N-nary designs using binary-based logic simulators is impractical. Unlike binary-based designs, the basic logic interconnection and propagation element in an N-nary-based design is not the individual gate input or output wire having a logical value of 1 or 0. Rather, in an N-nary-based logic design, the highway that connects the logic elements is the multi-wire N-nary signal that is capable of holding N values. Therefore, the present invention provides a methodology for simulating the N-nary signal value, not the binary bit-value of individual wires. Furthermore, the present invention provides for simulation of multiple signal drive strengths and the fact that a signal is undefined. The present invention can be practiced in the context of either a levelized simulation or an event-driven simulation.

Figure 1:
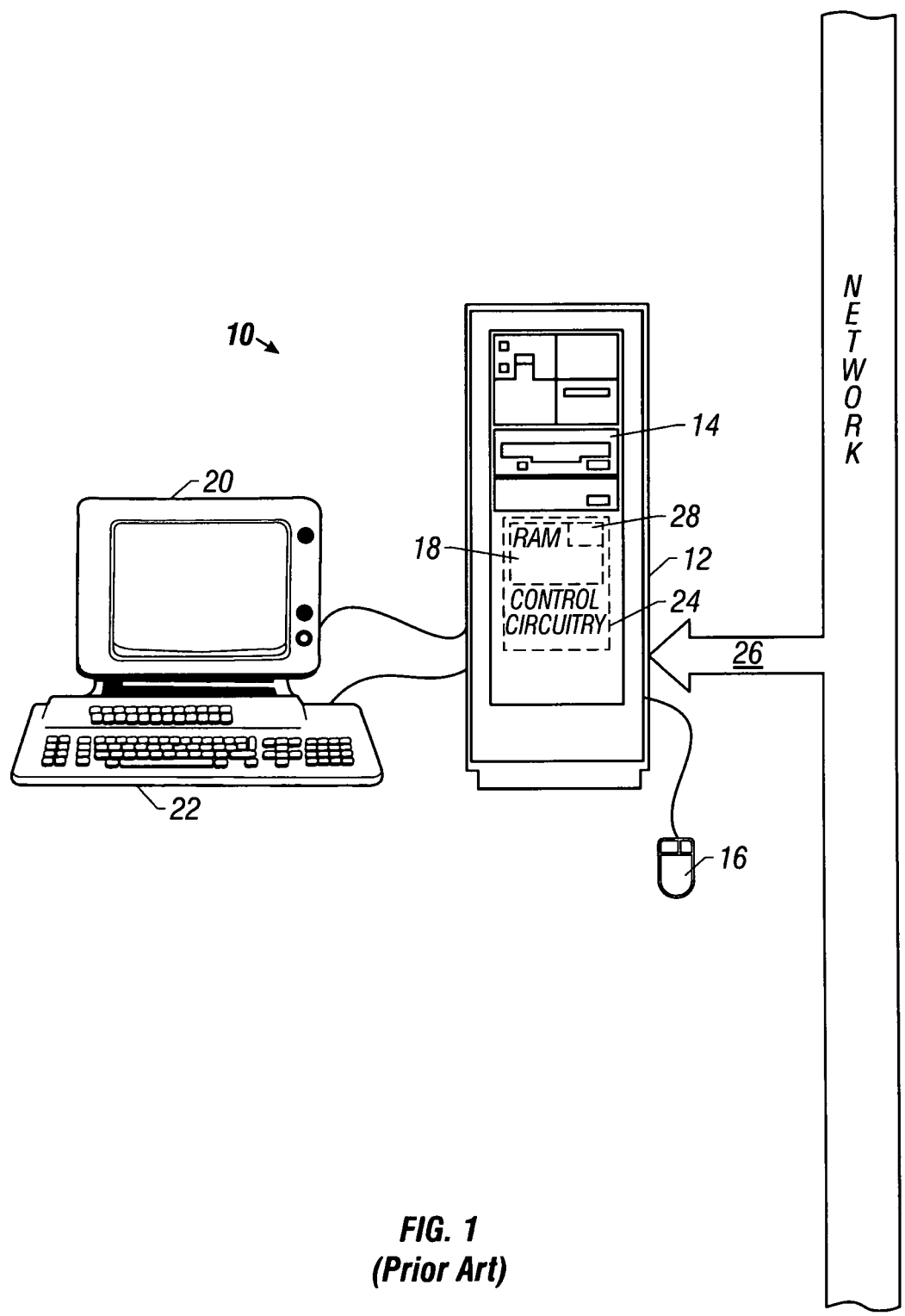
FIG. 1 shows a standard simulation workstation suitable for practicing the present invention.

FIG. 1 shows a standard simulation workstation 10 suitable for practicing the present invention. As shown in FIG. 1, the workstation 10 comprises a monitor 20 and keyboard 22, a processing unit 12, and various peripheral interface devices that might include a floppy drive 14 and a mouse 16. Processing unit 12 further includes internal memory 18, and internal storage (not shown in FIG. 1) such as a hard drive.

Simulation workstation 10 interfaces with digital control circuitry 24 and the circuit behavioral model 28. In the preferred embodiment shown in FIG. 1, digital control circuitry 24 is a general purpose computer including a central processing unit, RAM, and auxiliary memory. Circuit behavioral model 28 is an executable software-implemented simulation model that is an output from the circuit design tool disclosed in the N-nary Design Tools Patents. Both the behavioral model 28 and the digital control circuitry are shown in FIG. 1 as residing within processing unit 12 of workstation 10, but both components could be located in whole or in part elsewhere, and interface with workstation 10 over connection 26. As shown in FIG. 1, connection 26 could be a connection to a network of computers or other simulation workstations, which could also be connected to printers, external storage, additional computing resourses, and other network peripherals. Alternatively, connection 26 could connect to a specific simulation device containing (in whole or in part) digital control circuitry 24 and behavioral model 28. One skilled in the art will recognize that the present invention can be practiced upon any of the well known specific physical configurations of standalone or networked software simulation workstations.

The operator interfaces with digital control circuitry 24 and the software behavioral model 28 via the keyboard 22 and/or the mouse 16. Control circuitry 24 is capable of providing output information to the monitor 20, the network interface 26, and a printer (not shown in FIG. 1).

Figure 2:
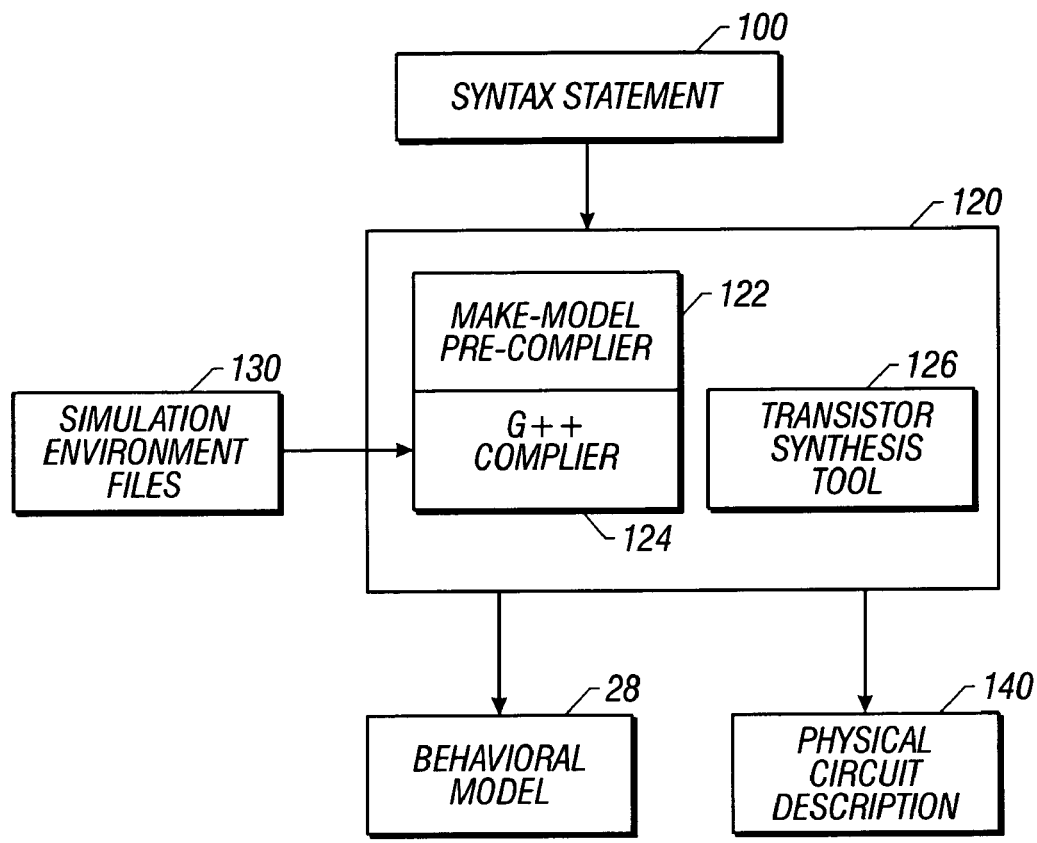
FIG. 2 is a block diagram of the N-nary Design Tool that creates the behavioral model of the present invention.

FIG. 2 is a block diagram of the N-nary Design Tool that, among other things, generates the behavioral model 28 that is central to the present invention. Referring to FIG. 2, the operator first creates the gate syntax statement 100 that comprises one or more gate instantiation statements as described in the N-nary Design Tools Patents. As described more fully in the N-nary Design Tools Patents, the gate syntax statement 100 is preferably encoded in a combination of ANSI C++ and N-nary C, but could be written in any programming language. The N-nary design tool compiler 120, which further comprises a make-model pre-compiler 122, a commercially-available C compiler known as "g++" 124, and a transistor synthesis tool 126, compiles the gate syntax statement 100 along with simulation environment files 130, discussed in more detail below. The design tool compiler 120 then 1>generates the physical circuit description 140 described by the gate syntax statement, and its matching behavioral model 28. As further described in the N-nary Design Tools Patents, unlike prior art behavioral models and their accompanying physical circuits, the syntax statement describes the specific physical arrangement of transistors and circuits envisioned by the designer, and the behavioral model generated by the design tool from the syntax statement includes a precise implementation of that specific physical transistor arrangement. This precision and ability to specify and simulate a physical design with particularity is a novel and important improvement over prior art design tools. For a complete description of the N-nary Design Tool, the N-nary C language, and how the tool and language are used in the design process, the reader is referred to the N-nary Design Tools Patents.

Figure 3:
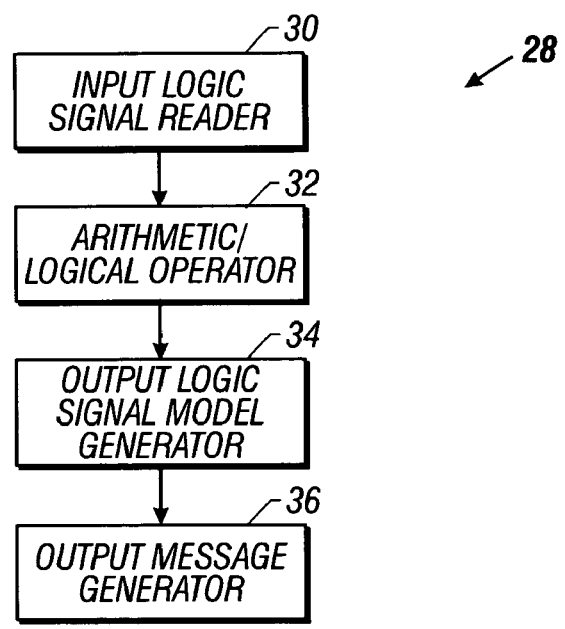
FIG. 3 is a functional block diagram of a typical behavioral model generated by the N-nary Design Tool.

FIG. 3 shows the components of behavioral model 28. Behavioral model 28 is an executable simulation file that is generated by compiling the syntax statement 100 and the simulation environment files 130, and linking the resulting object files together. The gate syntax statement 100 compiles into the arithmetic/logical operator 32, which is the model component that actually contains the lines of code that mathematically or logically simulate the operation of the gate under design. The simulation environment files 130 compile into an input logic signal reader 30, an output logic signal model generator 34, and an output message generator 36. Those skilled in the art will appreciate that while FIG. 3 implies that these model components are separate and sequential, the input logic signal reader 30, the output logic signal model generator 34, and the output message generator 36 are more accurately described as infrastructure that is intertwined with and supports the arithmetic/logical operator 32.

The simulation environment files 130 can be written in any programming language, but in a preferred embodiment, are written in a version of ANSI C++ that is compatible with the g++ compiler 124 within the Design Tool Compiler 120. The simulation environment files provide the interface between the operator and the simulated logic, and enable the operator to specify test-related variables such as the types of tests to be run in the simulation, input signals, output points, and output content and format. In a preferred embodiment, the simulation environment files will include the monitor and monitoring methods disclosed in the following copending U.S. patent applications:

| U.S. patent application Ser. No. | Date Filed | Title |
| --- | --- | --- |
| 09/406,017 | Sep. 24, 1999 | Method and Apparatus For a Monitor that Detects and Reports a Status Event to a Database |
| 09/406,016 | Sep. 24, 1999 | Method and Apparatus that Reports Multiple Microprocessor Events with a Single Monitor |

Both of these documents, collectively referred to hereinafter as "the Monitor Patents," are hereby incorporated herein in their entirety for all purposes.

Other than the novel monitor and monitoring methods disclosed in the above copending Monitor Patents, those skilled in the art are generally well acquainted with the creation, content, and use of simulation environment files. Consequently, the environment-file related components of the behavioral model 28 will be described only in terms of their major functions.

For each cycle through a cycle-driven simulation, or each evaluation during an event-driven simulation, the input logic signal reader 30 reads validity, value, and drive strength for each input signal and provides that information to the arithmetic/logical operator 32, which is described in detail below in three different exemplary preferred embodiments. As is also described in further detail below, the output of the arithmetic/logical operator 32 is the value, drive strength, and validity of the gate's output signal(s) as a function of its input signal(s). The arithmetic/logical operator 32 provides that information to the output logic signal model generator 34, which then constructs a signal model according to the present invention that corresponds to each of gate's output signals. Finally, as is described in more detail below, during the simulation, the output message generator 36 constructs an output message that can be accessed at any time during the simulation or when the simulation is complete, that provides diagnostic information, statistics, and other information useful in determining whether the gate is operating in accordance with the designer's intent.

The ability to generate, from a descriptive gate statement, a specific gate configuration, coupled with a software-implemented behavioral model that is a precise representation of that configuration and that is suitable for running simulations, is the subject of the N-nary Design Tools Patents. The present invention focuses on the contents of the arithmetic/logical operator 28 component of the behavioral model 28, and the simulation methods and techniques that can be applied to N-nary designs, resulting in a much more efficient simulation for certain operations. The present invention further comprises a novel methodology for modeling signals applicable in designs where signals can have unique decimal values in addition to 0 or 1. Finally, the present invention comprises an output generator usable in a simulation environment that improves the efficiency of the creation and storage of simulation output messages, because it packs output data into output messages that are sized to be compatible with the simulation host's bus architecture.

The N-nary Signal Model

The first key to the signal model of the present invention is that in modeling input signals and determining output signals, only meaningful N-nary signal values are represented. Specific wire values are not modeled because it is the N-nary signal value that is important. Moreover, any combination of asserted and unasserted wires that does not define a meaningful signal is construed as an undefined signal.

For example, Signal A, shown in Table 2, comprises four wires, encoded in four different, but very specific ways to represent signal decimal values 0, 1, 2, and 3. If Signal A is a signal in an N-nary logical design that does not support "null" value N-nary signals, then the four encodings represented by the four combinations of binary values shown in Table 2 on wires A[0] through A[3] are the only encodings that produce a valid signal. Therefore, although wires A[0] through A[3] could be encoded in 16 different ways, the four encodings shown in Table 2 are the only four encodings that result in a valid N-nary signal for a design that does not support "null" values. (There are five possible encodings for a 1-of-4 signal in a logic environment that supports null values.) Under N-nary design principles, the remaining 12 (or 11, if Signal A could validly hold a "null" value) possible combinations of binary values for wires A[0] through A[3] are treated as an undefined, invalid signal. This concept allows signal A to be modeled in a non-null value environment as having five potential values: 0, 1, 2, 3 (as represented by the binary encodings shown in Table 2) or undefined (if the binary encodings comprise any of the other twelve possible combinations). In an environment where null value signals are supported, signal A can be modeled as having six potential values: null, 0, 1, 2, 3, or undefined. In contrast, if this signal were modeled for either environment at the wire level, sixteen possible combinations would have to be accounted for, even though in N-nary logic, most of those combinations are meaningless.

Modeling N-nary signals at the signal level rather than the wire level provides an enormous advantage in terms of the efficiency of memory usage in the simulation environment. Like related art simulation models, the present invention stores each potential signal value in an individually addressable storage location. This allows the simulator to access any memory location to determine any desired signal value in random order. Since current popular microprocessors support direct access of bytes, the present invention stores signal value information in at least a byte. This invention may also be practiced in storage increments of a word (32-bits), which may be a preferable embodiment where the host machine running the simulation performs better when memory accesses are word-sized rather than byte-sized.

However, because there are at least eight bits of storage used per signal, it is possible to store a great deal of information about the signal, beyond its unique decimal value, for each byte-sized memory access. For a simulator modeling designs of greater than binary order, we choose to use the available storage possibilities to encode the additional possible signal values of an N-nary signal beyond the binary values 0 and 1, along with signal state information like drive level. Because storing signal value information, rather than wire value information, eliminates so many potential wire combinations that must be modeled, even the increase required to provide entries for multiple drive states of the various valid signal values results in significantly less overall memory usage than a comparable binary-based extended-state model.

FIG. 4 shows a preferred embodiment of the simulation representation of an N-nary signal 200. The signal model 200 is partitioned into three fields that together require a byte of memory in a host simulation machine. Signal model 200 includes a signal definition field 202 corresponding to bit 7 of the byte of storage, a signal strength field 204 corresponding to bits 6 and 5 of the storage byte, and a signal value field 206 corresponding to bits 0:4 of the storage byte. In FIG. 4, if the signal definition field 202 is set (i.e., bit 7 is set to 1), the signal is an undefined, invalid signal (corresponding to state "X"in a multi-state simulation.). As further shown in FIG. 4, the signal strength field (bits 6 and 5) can specify four possible signal drive strengths ranging from high-impedance (both bits set) to strong (neither bit set). Finally, in this embodiment, bits 4 through 0 are reserved for the value of an N-nary signal that can be as wide as a 1-of-32 signal (ranging from decimal value 0 to decimal value 31). By modeling N-nary input signals according to signal model 200, signal validity, value, and drive strength for the N wires in an N-nary signal can all be conveyed to the simulation in a single memory access.

After practicing this invention and/or reading this disclosure, those skilled in the art will appreciate that the signal model shown in FIG. 4 is only one embodiment potentially preferable for byte-sized memory accesses. Practitioners of the present invention may construct other signal models containing at least value information, drive strength information, and signal validity information without departing from the present invention.

Gate Simulation Using Arithmetic/Logic Expressions

The second key to the present invention is that higher level operations, such as arithmetic operations, are directly simulated, eliminating the need to first reduce the operation to a combination of simple Boolean logical operations. For example, in N-nary logic, addition can be performed directly on signals. A 1-of 2 input signal A and a 1-of 2 input signal B can be added to produce a 1-of-3 output signal C. That is, if A and B can each represent either the number 0 or 1, then the sum of the two numbers is either 0, 1 or 2. This same operation does not make sense at a primitive level with binary simulation because it is not possible to produce a trinary output. Instead, the sum must be deduced by first comparing bits via multiple well known boolean logic operations, and then producing a result value plus a carry-out value.

Figure 5A:
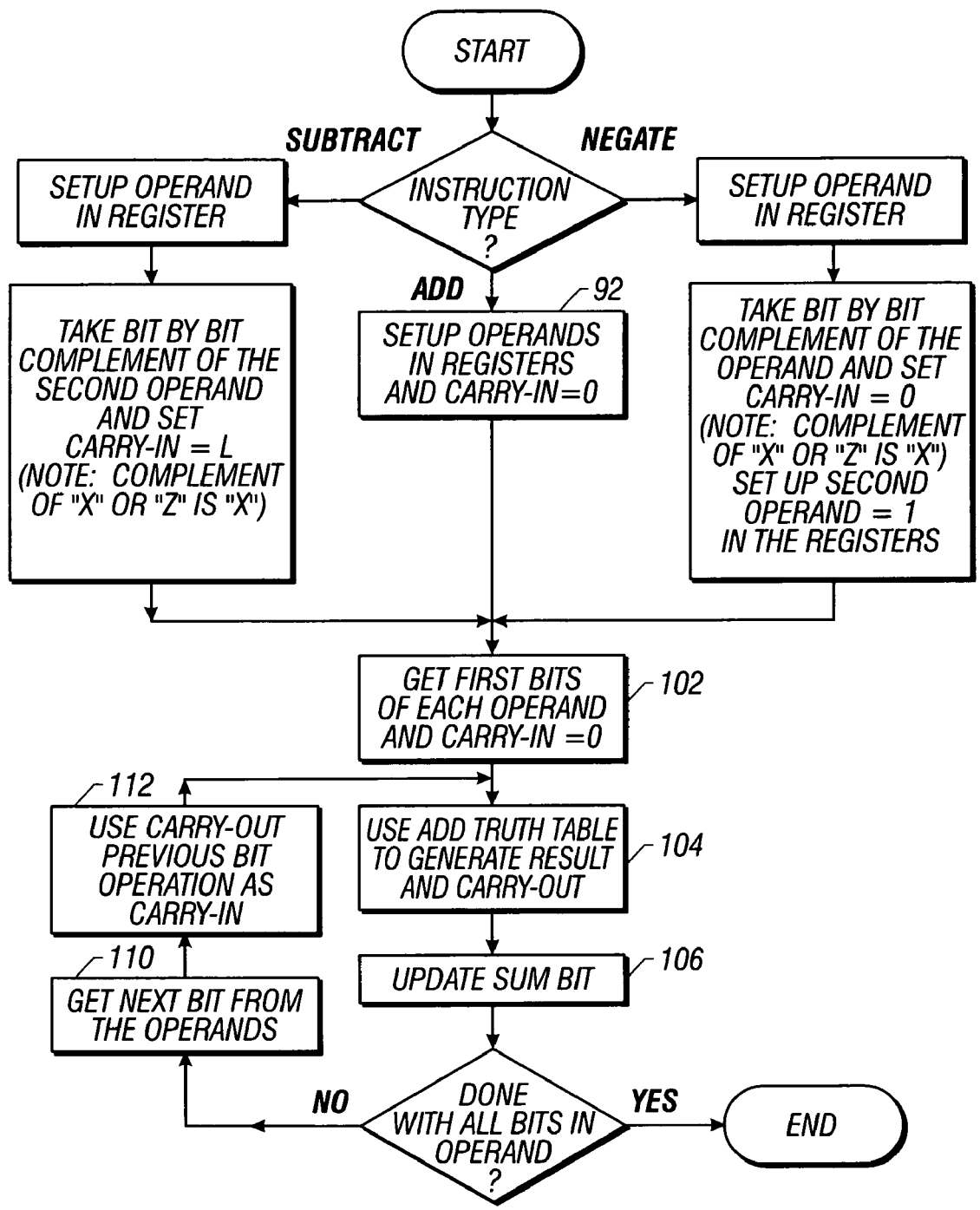

The following example illustrates this aspect of the present invention. Prior art simulators designed for binary-based logic designs simulate even simple gates by iteratively comparing input bits in simulated input signals and producing output bits comprising a result plus a carry-out. FIGS. 5A and 5B show a typical approach for simulating a binary-based simple arithmetic function employed by a prior art 4-level simulator. As shown in FIG. 5A, the simulator first sets up input operand and carry-in registers at 92, fetches the first bit of each operand and the first bit of the carry-in at 102, and looks up the result and the carry-out at 104 in the truth tables shown in FIG. 5B, which have been previously set up for the specific operation. The result is added to a sum bit at 106, and the carry-out becomes the carry-in for the next bit of each operand at 110 and 112. The process is then repeated for each bit of each input operand. The final result is an output and a carry-out, which might then become an input and a carry-in for the next gate.

In contrast, in an N-nary simulation of an add gate according to the present invention, the input signal decimal values represented in binary in bits 0 through 4 are simply added together to determine the output signal value. For example, if a designer desired a simple adder as described above (two 1-of-2 input signals A and B added together to produce a 1-of-3 output signal C), the designer might write the following syntax statement describing such a gate:

outC__3H2=in A__2H1+in B__2H1

Figure 6:
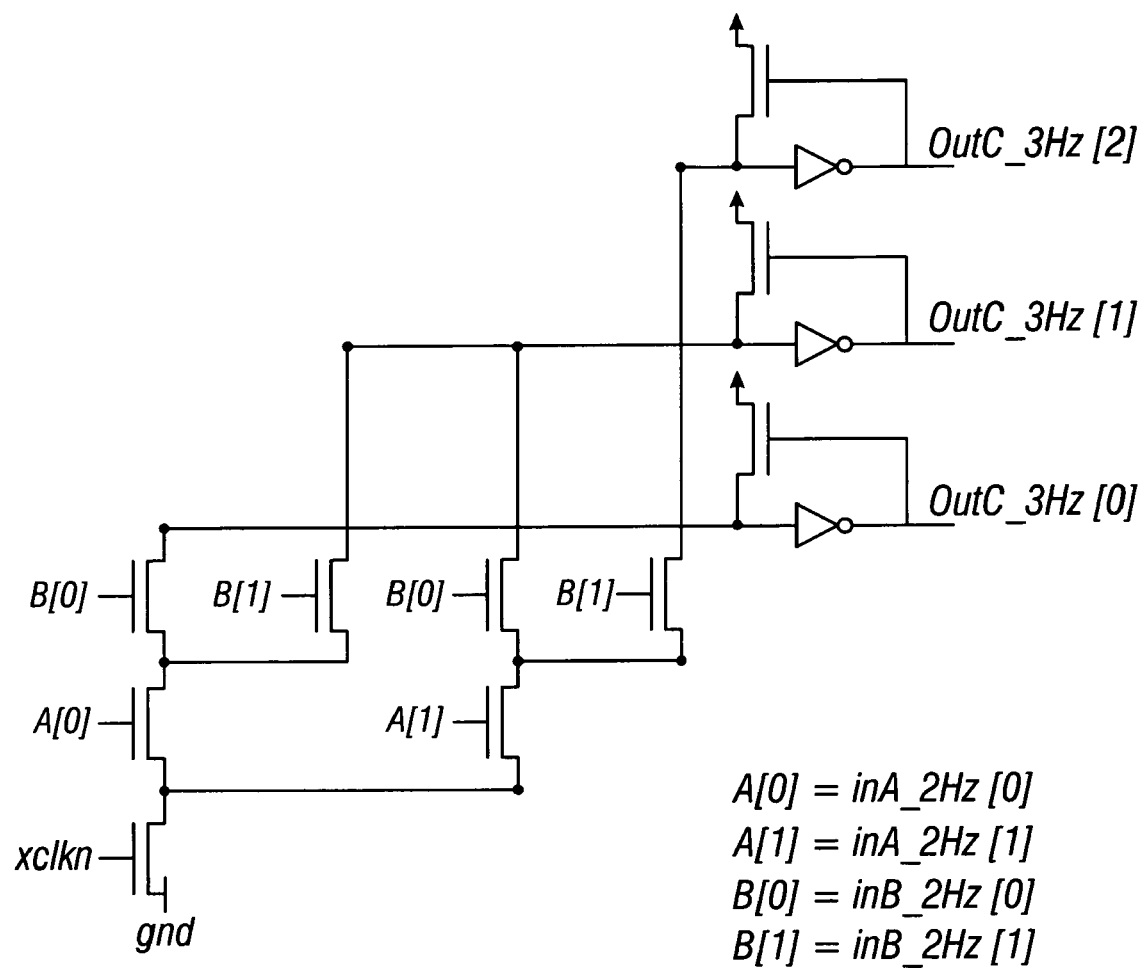
FIG. 6 shows the transistor arrangement defined by the N-nary syntax statement outC__3H2 in A__2H1+in B__2H1.

In accordance with the signal naming convention and the N-nary C language described in the N-nary Design Tools patents, this statement describes an adder wherein two input signals, in A_ and in B_each 1-of-2 signals that evaluate on the leading edge of the first clock phase, are added together to produce outC_, a 1-of-3 signal that evaluates on the leading edge of the second clock phase. The physical construction of the gate described by this statement (and that is generated by the Design Tool compiler) is shown in FIG. 6. However, the simulation of this gate does not involve generating transistors, evaluating input bits to specific transistors, or looking up output bits in truth tables. Rather, this statement would be compiled by the Design Tool compiler to the following set of instructions that simulate the operation of the gate:

```
load    reg1, inA__2H1       ; load N-nary value of inA__2H1 into reg1
load    reg2, inB__2H1       ; load N-nary value of inB__2H1 into reg2
add     reg 3, reg1, reg2    ; add values in reg1 and reg2 and put sum
                               in reg3
store   reg3, outC__3H2      ; put the sum in reg3 into outC__3H2.
```

This set of instructions comprises the arithmetic/logical operator component 32 of a behavioral model 28 that simulates the adder defined by the above gate syntax statement and depicted in FIG. 6. In a complete behavioral model 28 for this gate, these instructions would interface with read instructions wherein the unique decimal values of in A__2H1 and in B__2H1 would be read, instructions that construct the signal model for outC__3H2, and instructions that create an output message that can be monitored during the simulation or referred to after the simulation to determine various statistics relevant to the operation of the gate.

As this example shows, the present invention's capability of dealing with the decimal values of N-nary signals, and to compile into executable code, is an enormous improvement over prior art simulation methods, primarily because no truth tables and no deductions are required.

Like the adder demonstrated in the example above, the present invention enables the simulation of other logical and arithmetic functions by manipulation of N-nary signal values, rather than iterative, bit-by-bit comparison. Consider a simple multiplexer described by the following syntax statement:

Outsig__3H3=(insiga__3H3*(inselect__3H3=0)) (insigb__3H3*(inselect__3H3=1))|(insigc__3H3*(inselect__3H3 ==2));

In this gate, Outsig_a 1-of-3 N-nary signal that evaluates on the leading edge of the third clock phase, takes the same value as either insiga_, insigb_, or insigc_, all of which are 1-of-3 N-nary input signals that evaluate on the leading edge of the third clock phase, depending upon the value of inselect_, a fourth 1-of-3 N-nary input signal that evaluates on the leading edge of the third clock phase. In other words, when inselect_is 0, outsig_equals insiga_. When inselect_is 1 or 2, outsig_equals insigb_or insigc_, respectively. For a two-state simulation, this gate compiles to the following pseudo-assembly code, which comprises the arithmetic/logical operator 32 in a behavioral model 28 for this gate:

```
           move     reg3,0                ;reg3 is result reg, initialize to 0
           load     reg1,                 ;load N-nary value of
                    inselect__3H3           inselect__3H3 in reg 1
           compare  reg2, reg1, 0         ;compare inselect__3H3 value
                                            to 0 and put result in reg2
           bne      reg2, label1          ;if inselect__3H3 was not zero,
                                            branch to label1
           load     reg4,                 ;inselect__3H3 is zero, so load
                    insiga__3H3             N-nary value of insiga__3H3
                                            in reg4
           or       reg3, reg4            ;OR in reg4 to result reg3
label1:
           compare  reg2, reg1, 1         ;inselect__3H3 was not 0,
                                            check for 1 and store result
                                            in reg2
           bne      reg2, label2          ;if inselect__3H3 was not 1,
                                            branch to label2
           load     reg4,                 ;inselect__3H3 is 1,
                    insigb__3H3             so load N-nary value of
                                            insigb__3H3
                                            into reg4
           or       reg3, reg4            ;OR in reg4 to result reg3
label2:
           compare  reg2, reg1, 2         ;compare inselect__3H3 value
                                            to 2 and store result in reg2
           bne      reg2,                 ;if inselect__3H3 is not 2,
                    end__gate;              go to endgate
           load     reg4,                 ;inselect__3H3 is 2,
                    insigc__3H3             so load N-nary value of
                                            insigc__3H3 into reg4
           or       reg3, reg4            ;OR in reg4 to result reg3
end__gate:
           store    reg3,                 ;put the N-nary value loaded in
                    outsig__3H3             reg3 in outsig__3H3
```

Again, a complete behavioral model for this gate would also include simulation environment infrastructure that is not shown in this example. Additionally, those skilled in the art and familiar with the N-nary design style will understand that, since valid N-nary signals can have only one unique value, after finding a value for inselect__3H3, outsig__3H3 can be assigned the correct insigx value and the simulation for this gate can end. In other words, if the value of inselect__3H3 is found to be zero, further checks for 1 or 2 are unnecessary. Simulation performance can be improved by generating code that takes advantage of this feature of N-nary logic.

Designers interested in running a higher-state simulation for this gate could implement various approaches to incorporate the consideration of signal states into this model. For example, the gate's hardware designers could develop a set of rules for defining the signal state of a gate's output signal(s), based upon the signal state of one or more of the gate's input signal(s). These rules could then be implemented using a software tool that compiles with the gate syntax statement to generate additional instructions linked to the above simulation code. These additional instructions would assign a signal strength or state to outsig__3H3, based upon the signal strength or state of one or more of the gate's input signals and the background rules established by the hardware designer.

To illustrate this approach, consider the following rule-implementing software tool that includes the syntax statement for this gate. In this example, assume that the hardware designer has set up the rule that the output signal, Outsig_3H3, will ordinarily take the same signal strength as the input signal that it selects, based upon the value of the select signal, inselect_3H3. However, if inselect_3H3 is either uninitialized or undefined, then Outsig_3H3 will also be either uninitialized or undefined.

```
//set up input signal model according to FIG. 4
struct NNarySignal
{
unsigned Value: 5;
unsigned Str: 2;    //0x3 = z; 0x2 weak; 0x1 = moderate; 0x0 = strong
unsigned U: 1;      //0x1 = uninitialized; 0x1 = valid
}
```

```
//compute the signal value using the gate syntax statement
Outsig_3H3.Value=(insiga_3H3.Value     *(inselect_
    3H3.Value=0))|(insigb_3H3.Value*(inselect_
    3H3.Value=1))  1  (insigc_3H3.Value*(inselect_
    3H3.Value=2));
//now handle the x and z drive strengths:
//if the select is uninitialized, output is uninitialized
if (inselect_3H3.U=0x1)
    Outsig_3H3.U=0x1;
//if the select is z, output is a z
else if (inselect_3H3.Str=0x2)
    Outsig_3H3.Str=0x2;
//else the output gets the validity and strength of the insigx
    signal selected by the select signal
```

```
else {
    Outsig_3H3.U = (insiga_3H3.U * (inselect_3H3.Value = = 0)) |
        (insigb_3H3.U * (inselect_3H3.Value = = 1)) |
        (insigc_3H3.U * (inselect_3H3.Value = = 2));
    Outsig_3H3.Str = (insiga_3H3.Str * (inselect_3H3.Value = = 0)) |
        (insigb_3H3.Str * (inselect_3H3.Value = = 1)) |
        (insigc_3H3.Str * (inselect_3H3.Value = = 2));
}
```

This code would then compile to produce the correct checks and output strength assignment instructions linked to the value computation instructions in the arithmetic/logical operator 32 that is shown above for the behavioral model 28 for this gate.

Those skilled in the art will understand that the above example is only one way to simulate a gate's output signal validity and strength, based upon the signal validity and strength of the relevant gate inputs. The same function could be accomplished by using a C++ class to represent the N-nary signal, and defining specific functions for that class that adjust the signal value and signal strength of the output signal based upon the signal strength of the relevant input signals. Those skilled in the art are very familiar with these and other approaches that could be implemented in combination with the syntax statement to incorporate the consideration of multiple input signal strengths to achieve a multi-state simulation of an N-nary gate.

In contrast, simulating this multiplexer using this logic and arithmetic based technique would not be possible in a binary-based design. Rather, each input signal and the select signal would have to be implemented using two binary wires, and traditional bit-by-bit comparison using traditional truth table techniques would be required in order to evaluate the value of the select signal and determine the proper input signal to pass through the gate. While the truth tables for a 2-state simulation of this multiplexer are fairly straightforward, adding states adds significant complexity, depending upon what the designer requires for outsig and outsig carry-out when inselect and/or insiga, insigb, and insigc (or their carry-ins) are uninitialized, high-impedance, or weakly-driven.

As a final example of the capability of the present invention to arithmetically and logically manipulate N-nary signals at the signal value level, consider the following simple buffer represented by the gate syntax statement outsig_3H2=insig_3H1;

This statement describes a buffer wherein the value of insig_3H1, a 1-of-3 N-nary signal that evaluates on the leading edge of the first clock phase, is held for a clock phase, after which it propagates as outsig_3H2, a 1-of-3 N-nary signal that evaluates on the leading edge of the second clock phase. The present invention compiles this gate syntax statement to the following simulation instructions for the arithmetic/logical operator component 32 of a behavioral model 28 for this gate:

```
load    reg1, insig_3H1    ;load N-nary value of insig_3H1 into reg1
store   reg1, outsig_3H2   ;store N-nary value in reg1 into outsig_3H2
```

Again, no truth tables or bit comparisons are required. The present invention simulates this buffer using two lines of executable code.

Referring back to FIG. 4, we see that the signal model of the present invention is set up to take advantage of the capability of the simulator of the present invention to simulate the operation of a gate by logically and arithmetically manipulating N-nary signals at the signal's decimal value level, rather than at the bit/wire level. In the model, signal defintion, strength, and value information is arranged such that "normal" signals—defined signals with a unique decimal value that is fully driven—are encoded such that the most significant bits of the byte are zero. This allows designers uninterested in higher-state simulations to perform the arithmetic and logical operations described above on the signal values without regard to the three most significant bits. Dealing with signals at the N-nary value level, rather than at the wire-and-bit level, thus simplifies and improves the efficiency of the simulator.

Packed Output Message

The present invention also allows designers to adjust the simulation environment, check for logic errors and other errors and signal parameters of interest. To be of maximum use, a simulation tool must interface to the designer, and allow the designer to define input signals and the characteristics of those signals, monitor the progress of signals as they propagate through the logic, and examine characteristics of the logic inputs and outputs. This interface is commonly accomplished via the simulation environment files.

Designers define the simulation environment by providing inputs, selecting certain events of interest that may occur during simulation, and using those events to trigger other tracing, diagnostic, or recording events. These triggering and recording events are selected by the designer and programmed into the simulation environment files, which are then compiled and linked to the logic simulation files to create the executable simulation program. The simulation environment generates the appropriate triggering, testing, and recording instructions, which are executed during the simulation without affecting the simulated logic. For a more detailed description of a simulation environment that includes a preferred method of monitoring and recording simulation events, the reader is referred to the Monitor Patents.

During a simulation, a designer may want to monitor certain outputs or other events using the method disclosed in the Monitor Patents or some other monitoring or recording method that records information for later examination and analysis. The present invention supports the use of triggering events to record and monitor the simulation, and additionally improves upon the simulation environment parameters available in prior art simulators by simplifying the extraction of signal information and improving the efficiency of the storage of diagnostic and monitoring information generated during simulation. Since the N-Nary logic style specifically calls for naming the signals according to type and width, information about each signal is easily extracted by the simulation environment and stored in a table in memory. For example, in a preferred embodiment of the present invention, wherein the simulation host has a 32-bit bus structure, diagnostic information about an input signal or an output signal of a selected gate of interest could be efficiently extracted and stored as shown in FIG. 7, for later examination.

Figure 7:
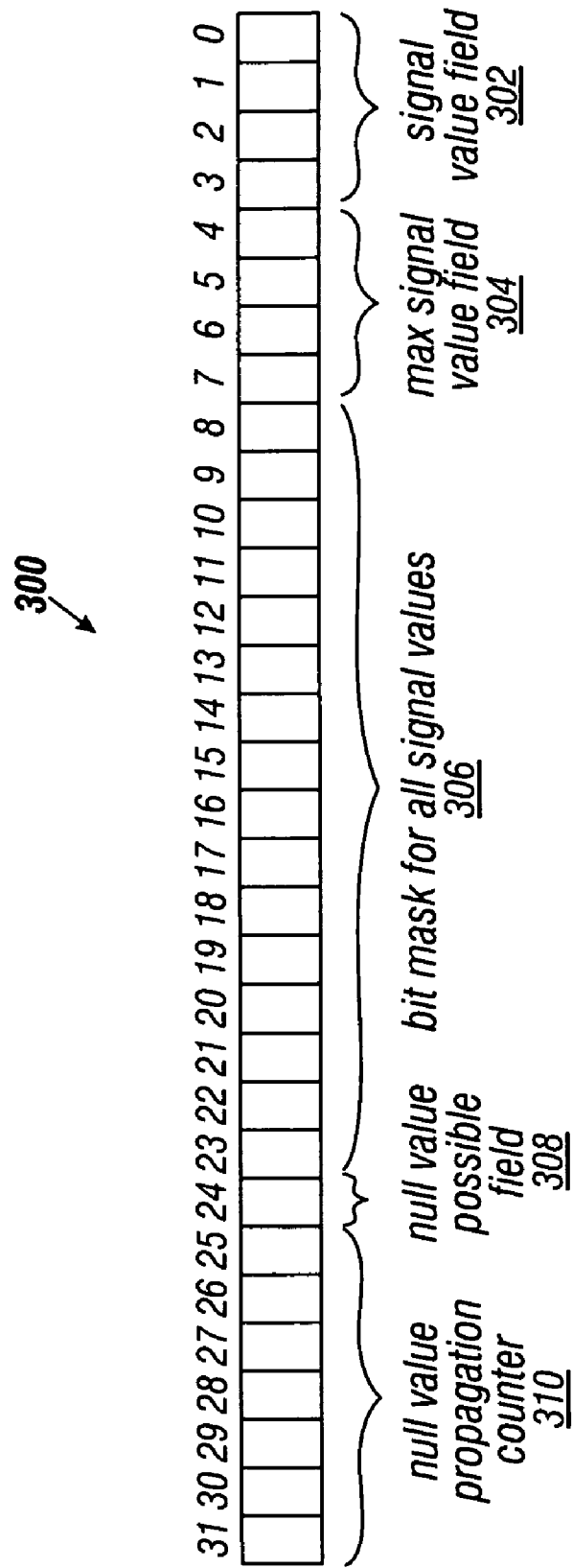
FIG. 7 shows a preferred embodiment of the output diagnostic message of the present invention, where the present invention is practiced on a simulation host having a 32-bit bus structure.

In the example output message 300 shown in FIG. 7, the signal value field 302 (bits 3:0) contains a decimal signal value. In this embodiment, the decimal value that can be held by an N-nary signal as large as a 1-of-16 signal can be represented. Depending upon the needs of the designer, the signal value in bits 3:0 might be the initial signal value, or it might be the last value the signal has held during the simulation. The maximum signal value field 304 (bits 7:4) holds the maximum value the signal of interest has held, thus allowing for dynamic error checking to ensure that the signal value does not go out of range during simulation. The bit mask 306 (bits 23:8) contains a bit mask that shows every value that the signal has held, allowing the designer to ensure that every possible value of a signal is encountered during verification. The null value possible field 308 (bit 24) is set if the signal is capable of null value propagation; and the null value propagation counter 310 (bits 31:25) contains a count of the number of times the signal propagated a null value.

To generate the output message 300 shown in FIG. 7, after the code sequence that determines the signal characteristics executes, the simulation environment checks the signal value and stores it in bits 3:0. The environment checks to insure that the signal's current value is not greater than the maximum signal value stored in bits 7:4. If the signal has gone out of range, an error is reported. If the signal value is within the maximum range, a bit mask that equates to the signal value is computed and stored in the proper location (bits 23:8). For example, if the signal value is 0, the bit mask is (1<<0) or b1 (hex 1). This value is OR'd with the output message to set bit 8, indicating that the signal has held the value of 0. If the signal value is 5, the bit mask is (1<<5) or b100000 (hex 20), and bit 13 is set, indicating that the signal has held the value of 5. If the signal value is 10, the bit mask is (1<<10) or b10000000000 (hex 400), and bit 18 is set, indicating that the signal has held the value of 10. Proceeding along this fashion, at the end of the simulation, if the signal of interest to which this output message applies is a 1-of-16 N-nary signal that has held all 16 possible values (0–15), then every bit from bit 8 through bit 23 will be set.

During each cycle or after each evaluation event, bit 24 is checked to determine whether the signal is capable of null value propagation. If it is, and if the signal is determined to have a null value when it evaluates (meaning that none of the N wires in the signal is asserted), then the integer value stored in bits 31:25 is incremented, thus counting the number of times in the simulation that a null value is propagated in signals capable of null value propagation. If an overflow would occur (meaning that, in this example, the signal is capable of null value propagation and in fact, had a null value at evaluation more than 127 times during a simulation) then the result is left saturated at 127 (i.e., bits 31:25 all set to 1).

At any time during the simulation or afterwards, the contents of the output message can be examined to convey information about the signal. For example, zeros in the bit mask field after the simulation is complete could indicate to the designer that either the simulation was inadequate or that there is a design error in the logic. If the output message relates to an input signal, zeros in the bit mask field might indicate that potential values that the input signal can hold were not simulated. Alternatively, if the output message relates to an output signal, zeros in the bit mask field might indicate that the gate's inputs were insufficient to allow every potential output signal value to be reached during the simulation, or they could indicate that there is an unreachable state in the logic, and thus a potential logic error.

On the other hand, in a simulation where the signal of interest is not a particularly wide signal, if the most significant bits in the bit mask field are set, the signal went out of range during the simulation, which also indicates an error condition.

The output message construction shown in FIG. 7 demonstrates the flexibility of the N-nary simulation environment of the present invention. By employing this preferred embodiment of the output message, practitioners of the present invention working on a host machine with a 32-bit bus architecture will pack useful output data into an output message in a manner that constitutes the most efficient utilization of the host machine's architecture. Nevertheless, designers setting up a simulation for an N-nary logic design can construct other monitoring and verification data arrangements, depending upon the signal parameters in which they are interested, and the architecture of the host machine.

In sum, the present invention comprises a method of efficiently simulating logic designs comprising signals that are capable of having more than two unique decimal values and multiple unique drive states, such as designs based upon the new N-nary logic design style. The present invention includes a signal model, a method and apparatus for efficiently simulating N-nary gates, and an output message generator that generates an output message tailored to the gate designer's needs and the simulation host architecture.

Other embodiments of the invention will be apparent to those skilled in the art after considering this specification or practicing the disclosed invention. The specification and examples above are exemplary only, with the true scope of the invention being indicated by the following claims.

We claim:

1. A signal model used in an N-NARY logic simulation, comprising:

a signal value, said signal value further comprises the logic value of a nonbinary 1-of-N logic signal being modeled, wherein said logic value further comprises an integer greater than 1;

a signal strength, said signal strength further comprises the drive state of said nonbinary 1-of-N logic signal being modeled; and a signal definition, said signal definition further comprises the defined or undefined status of said nonbinary 1-of-N logic signal being modeled.

2. The model of claim 1, wherein said logic value further comprises an integer less than or equal to 31.

3. The model of claim 1, wherein said signal strength further comprises one of the following: the high-impedance state, the weakly-driven state, the moderately-driven state, or the strongly-driven state.

4. A method that makes a signal model used in an N-NARY logic simulation, comprising:

assigning a signal value, said signal value further comprises the logic value of a nonbinary 1-of-N logic signal being modeled, wherein said logic value further comprises an integer greater than 1;

assigning a signal strength, said signal strength further comprises the drive state of said nonbinary 1-of-N logic signal being modeled; and assigning a signal definition, said signal definition further comprises the defined or undefined status of said nonbinary 1-of-N logic signal being modeled.

5. The method of claim 4, wherein said logic value further comprises an integer less than or equal to 31.

6. The method of claim 4, wherein said signal strength further comprises one of the following: the high-impedance state, the weakly-driven state, the moderately-driven state, or the strongly-driven state.

7. A method that uses a signal model used in an N-NARY logic simulation, comprising:

reading a signal value, said signal value further comprises the logic value of a nonbinary 1-of-N logic signal being modeled, wherein said logic value further comprises an integer greater than 1;

reading a signal strength, said signal strength further comprises the drive state of said nonbinary 1-of-N logic signal being modeled;

reading a signal definition, said signal definition further comprises the defined or undefined status of said nonbinary 1-of-N logic signal being modeled; and providing said signal value, said signal state, and said signal definition to the software-implemented simulation of the N-NARY logic design.

8. The method of claim 7, wherein said logic value further comprises an integer less than or equal to 31.

9. The method of claim 7, wherein said signal strength further comprises one of the following: the high-impedance state, the weakly-driven state, the moderately-driven state, or the strongly-driven state.

10. A program storage device readable by a machine, tangibly embodying a program of instructions executable by the machine to perform a method that uses a signal model used in an N-NARY logic simulation, comprising:

reading a signal value, said signal value further comprises the logic value of a nonbinary 1-of-N logic signal being modeled, wherein said logic value further comprises an integer greater than 1;

reading a signal strength, said signal strength further comprises the drive state of said nonbinary 1-of-N logic signal being modeled;

reading a signal definition, said signal definition further comprises the defined or undefined status of said nonbinary 1-of-N logic signal being modeled; and providing said signal value, said signal state, and said signal definition to the software-implemented simulation of the N-NARY logic design.

11. The program storage device of claim 10, wherein said logic value further comprises an integer less than or equal to 31.

12. The program storage device of claim 10, wherein said signal strength further comprises one of the following: the high-impedance state, the weakly-driven state, the moderately-driven state, or the strongly-driven state.

13. A signal modeling system used in an N-NARY logic simulation, comprising:

a signal value, said signal value further comprises the logic value of a nonbinary 1-of-N logic signal being modeled, wherein said logic value further comprises an integer greater than 1;

a signal strength, said signal strength further comprises the drive state of said nonbinary 1-of-N logic signal being modeled; and a signal definition, said signal definition further comprises the defined or undefined status of said nonbinary 1-of-N logic signal being modeled.

14. The system of claim 13, wherein said logic value further comprises an integer less than or equal to 31.

15. The system of claim 13, wherein said signal strength further comprises one of the following: the high-impedance state, the weakly-driven state, the moderately-driven state, or the strongly-driven state.

* * * * *

UNITED STATES PATENT AND TRADEMARK OFFICE
CERTIFICATE OF CORRECTION

PATENT NO. : 7,031,897 B1
APPLICATION NO. : 09/405618
DATED : April 18, 2006
INVENTOR(S) : James S. Blomgren et al.

It is certified that error appears in the above-identified patent and that said Letters Patent is hereby corrected as shown below:

On the Title Pg, Item (56), under "Other Publications", line 2, delete "Interoperbility" and insert -- Interoperability --, therefor.

On Sheet 2 of 7, Box No. 122, Figure 2, line 2, delete "complier" and insert -- compiler --, therefor.

On Sheet 2 of 7, Box No. 124, Figure 2, line 2, delete "complier" and insert -- compiler --, therefor.

In column 1, line 47, delete "THESE" and insert -- These --, therefor.

In column 6, line 6, delete "tables" and insert -- tables. --, therefor.

In column 7, line 6, delete "resourses," and insert -- resources, --, therefor.

In column 7, line 34, delete "1>generates" and insert -- generates --, therefor.

In column 11, line 58, after "0))" insert -- | --, therefor.

In column 12, line 31, delete "endgate" and insert -- end_gate --, therefor.

In column 13, line 14, delete "0×1" and insert -- 0×0 --, therefor.

In column 13, line 20, after "Value=1))" delete "1" and insert -- | --, therefor.

In column 13, line 21, delete "Value=2));" and insert -- Value==2)); --, therefor.

In column 14, line 37, delete "defintion," and insert -- definition, --, therefor.

Signed and Sealed this
Fifteenth Day of November, 2011

David J. Kappos
*Director of the United States Patent and Trademark Office*